(12) United States Patent
Anderson et al.

(10) Patent No.: US 8,916,932 B2
(45) Date of Patent: Dec. 23, 2014

(54) SEMICONDUCTOR DEVICE INCLUDING FINFET STRUCTURES WITH VARIED EPITAXIAL REGIONS, RELATED METHOD AND DESIGN STRUCTURE

(71) Applicant: International Business Machines Corporation, Armonk, NY (US)

(72) Inventors: Brent A. Anderson, Jericho, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 38 days.

(21) Appl. No.: 13/889,848

(22) Filed: May 8, 2013

(65) Prior Publication Data

US 2014/0332888 A1 Nov. 13, 2014

(51) Int. Cl.
*H01L 29/78* (2006.01)
*H01L 29/66* (2006.01)

(52) U.S. Cl.
CPC ...... *H01L 29/7856* (2013.01); *H01L 29/66772* (2013.01)
USPC ............................. 257/347; 257/350; 257/288

(58) Field of Classification Search
USPC .................. 257/205, 206, 288, 341, 350, 401
See application file for complete search history.

(56) References Cited

U.S. PATENT DOCUMENTS

| | | | |
|---|---|---|---|
| 7,078,299 B2 | 7/2006 | Maszara et al. | |
| 7,271,448 B2 | 9/2007 | Hsu et al. | |
| 7,772,048 B2 | 8/2010 | Jones et al. | |
| 8,110,466 B2 * | 2/2012 | Shieh et al. | 438/268 |
| 2006/0076625 A1 | 4/2006 | Lee et al. | |
| 2008/0105897 A1 | 5/2008 | Zhu | |
| 2010/0038679 A1 * | 2/2010 | Chan et al. | 257/190 |
| 2010/0164530 A1 | 7/2010 | Hoentschel et al. | |
| 2011/0210393 A1 | 9/2011 | Chen et al. | |
| 2011/0316081 A1 * | 12/2011 | Chan et al. | 257/347 |
| 2013/0200455 A1 * | 8/2013 | Lo et al. | 257/347 |
| 2014/0145248 A1 * | 5/2014 | Cheng et al. | 257/288 |

* cited by examiner

*Primary Examiner* — Thao P Le
(74) *Attorney, Agent, or Firm* — Michael J. LeStrange; Hoffman Warnick LLC

(57) ABSTRACT

A semiconductor device including a substrate; a FINFET disposed on the substrate, the FINFET including: a set of epitaxial regions disposed in a source/drain region on a set of fins, the set of epitaxial regions including: a first epitaxial region on a first inner surface of a first outer fin, the first epitaxial region having a first thickness defined as one of: a distance from the first inner surface to an edge of the epitaxial region in the case of a non-merged state of adjacent inner epitaxial regions of adjacent fins, and half of a distance from the first inner surface to an opposing inner surface of an adjacent fin in a merged state of adjacent inner epitaxial regions of adjacent fins, and a second epitaxial region with a second thickness disposed on a first outer surface of the first outer fin. The second thickness is thinner than the first thickness.

18 Claims, 10 Drawing Sheets

SEMICONDUCTOR DEVICE INCLUDING FINFET STRUCTURES WITH VARIED EPITAXIAL REGIONS, RELATED METHOD AND DESIGN STRUCTURE

TECHNICAL FIELD

Embodiments of this disclosure relate generally to semiconductor devices and, more particularly, to a semiconductor device including a fin-shaped field effect transistor (FINFET) which is substantially optimized and includes an improved density, a related method and design structure.

BACKGROUND

In semiconductor devices, fin-shaped field effect transistors (FINFET) are often used to increase device functionality and versatility, and to decrease device size and improve device performance. Semiconductor device manufacturing and design may be limited by application and/or creation of FINFETS as a result of process limitations related to FINFET density. In the manufacturing of some FINFETS, epitaxial silicon may be grown in source/drain regions to improve series resistance in the FINFET. This epitaxial silicon may increase the effective width of the fins, which reduces the spacing between fin sources/drains and gate contacts, potentially causing issues such as gate contact shorting (e.g., to expanded source/drain regions) which may limit the number of fins which may be created in FINFET designs. This fin limitation may cause an increase in the number of library tracks on the device and/or may lower performance per area values for the entire semiconductor device.

BRIEF SUMMARY

A first aspect of the disclosure provides a semiconductor device comprising: a substrate; and a fin-shaped field effect transistor (FINFET) disposed on the substrate, the FINFET including: a set of fins disposed proximate a gate; and a set of epitaxial regions disposed in a source/drain region on the set of fins, the set of epitaxial regions including: a first epitaxial region on a first inner surface of a first outer fin, the first epitaxial region having a first thickness defined as one of: a) a distance from the first inner surface to an edge of the epitaxial region in the case of a non-merged state of adjacent inner epitaxial regions of adjacent fins, and b) half of a distance from the first inner surface to an opposing inner surface of an adjacent fin in a merged state of adjacent inner epitaxial regions of adjacent fins, and a second epitaxial region with a second thickness disposed on a first outer surface of the first outer fin, wherein the second thickness is thinner than the first thickness.

A second aspect of the disclosure provides a method of forming a semiconductor device, the method comprising: forming a set of fins, the set of fins including a first outside fin; forming a gate including a gate contact, the gate contact located proximate to the first outside fin; forming a set of inner epitaxial regions between the set of fins including a first epitaxial region on an inner surface of a first outer fin, the first epitaxial region having a first thickness defined as one of: a) a distance from the first inner surface to an edge of the epitaxial region in the case of a non-merged state of adjacent inner epitaxial regions of adjacent fins, and b) half of a distance from the first inner surface to an opposing inner surface of an adjacent fin in a merged state of adjacent inner epitaxial regions of adjacent fins; and forming a gate epitaxial region on an outer surface of the first outside fin, the gate epitaxial region having a second thickness which is different than the first thickness of the set of inner epitaxial regions.

A third aspect of the disclosure provides a design structure embodied in a machine-readable storage medium for design, manufacturing, or testing, the design structure comprising text or a graphical representation of: a substrate; and a fin-shaped field effect transistor (FINFET) disposed on the substrate, the FINFET including: a set of fins disposed proximate a gate; and a set of epitaxial regions disposed on the set of fins, the set of epitaxial regions including a first epitaxial region with a first thickness disposed on a first inner surface of a first outer fin, and a second epitaxial region with a second thickness disposed on a first outer surface of the first outer fin, wherein the second thickness is thinner than the first thickness.

These and other aspects, advantages and salient features of the invention will become apparent from the following detailed description, which, when taken in conjunction with the annexed drawings, where like parts are designated by like reference characters throughout the drawings, disclose embodiments of the invention.

BRIEF DESCRIPTION OF THE DRAWINGS

The above and other aspects, features and advantages of the invention will be better understood by reading the following more particular description of the invention in conjunction with the accompanying drawings.

It is noted that the drawings of the invention are not necessarily to scale. The drawings are intended to depict only typical aspects of the invention, and therefore should not be considered as limiting the scope of the invention. It is understood that elements similarly numbered between the FIGURES may be substantially similar as described with reference to one another. Further, in embodiments shown and described with reference to FIGS. 1-14, like numbering may represent like elements. Redundant explanation of these elements has been omitted for clarity. Finally, it is understood that the components of FIGS. 1-14 and their accompanying descriptions may be applied to any embodiment described herein. The detailed description explains embodiments of the invention, together with advantages and features, by way of example with reference to the drawings.

DETAILED DESCRIPTION

Figure 1:
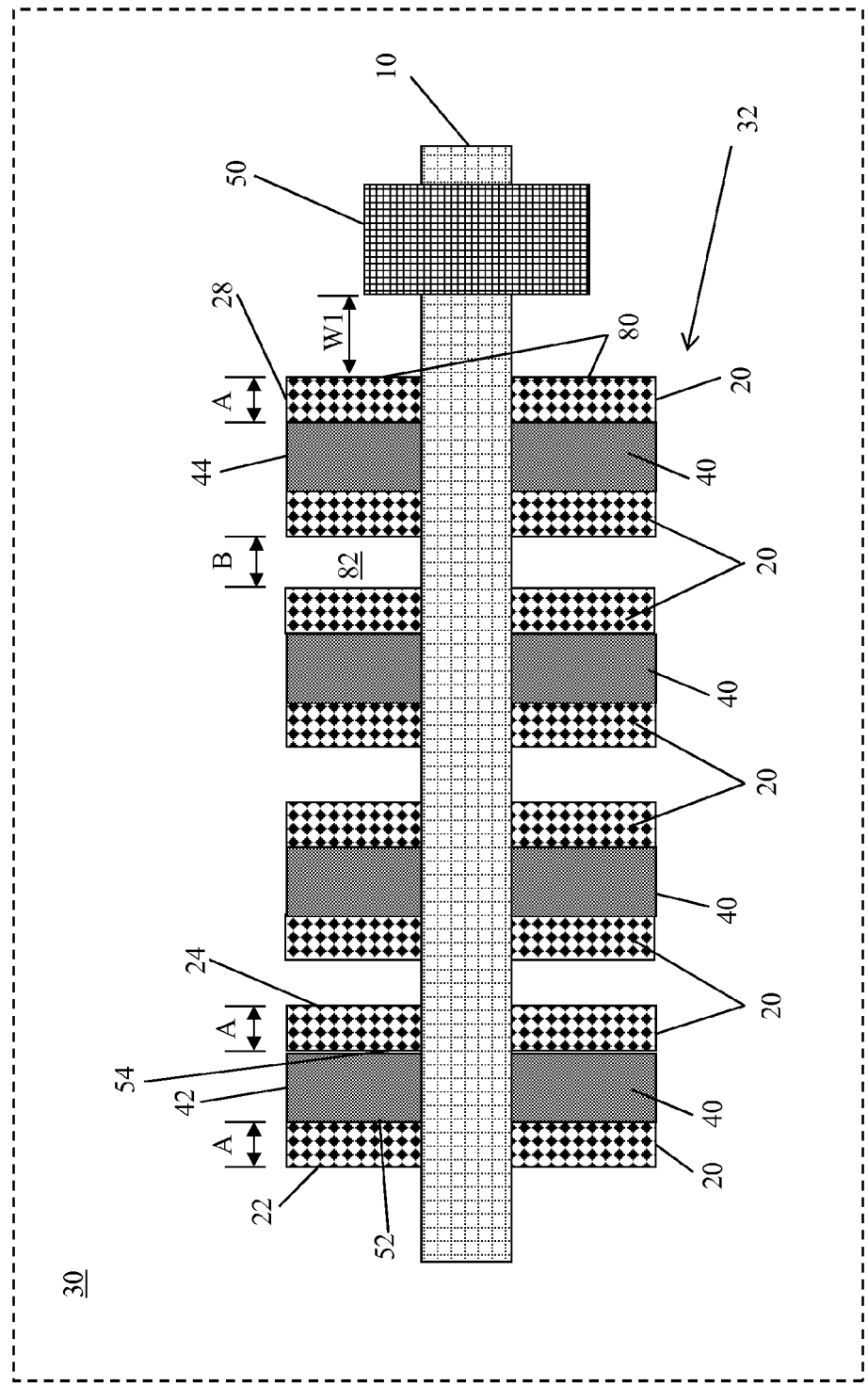
FIG. 1 is a demonstrative illustration of a top view of a portion of a semiconductor device.

FIG. 1 is a demonstrative illustration of a top view of a portion of a known substrate 30 (e.g., a portion of an integrated circuit) (shown in phantom) including a fin-shaped field effect transistor (FINFET) 32 (e.g., a non-merged FINFET 32) which includes a plurality of fins 40 connected to a gate 10. Plurality of fins 40 are connected along gate 10 proximate to a gate contact 50. A set of growths 20 (e.g., epitaxial growths) are disposed on plurality of fins 40. Set of growths 20 may be epitaxially grown on surfaces of plurality of fins 40 to improve series resistance in source/drain regions of FINFET 32. As can be seen, set of growths 20 are equal in size (e.g., the thickness of each of the set of growths is related/equivalent) on all sides of FINFET 32 as a result of the epitaxial growth formation. For example, a first fin 42 of set of fins 40 is connected to a first growth 22 on an outer surface 52 and a second growth 24 on an inner surface 54. First growth 22 and second growth 24 have a thickness 'A' which is substantially equivalent. A third growth 28 located proximate gate contact 50 defines a surface 80 located at a distance of 'W1' from gate contact 50. Surface 80 is formed during epitaxial growth of set of growths 20 (e.g., as silicon grows on surfaces of plurality of fins 40) and may impact some of the manufacturing processes, FINFET 32 performance, and/or substrate 30 performance. The distance 'W1' between gate contact 50 and surface 80 (e.g., third growth 28, third fin 44, etc.) is controlled by thickness A/epitaxial growth of third growth 28. As distance 'W1' is reduced during epitaxial growth, the chances that a short will occur between gate contact 50 and surface 80 increases. As a result, a number of fins 40 which may be disposed in FINFET 32, and/or a thickness 'A' (e.g., a width of growths 20) between all fins 40 of FINFET 32 may be limited as a result of this relation. Further, a gap 82 between plurality of fins 40/set of growths 20 has a thickness 'B' which is defined by the epitaxial growth of growths 20 (e.g., thickness A of set of growths 20). It is understood that growths 20 may include a plurality of metals and materials (e.g., silicon (Si), germanium (Ge), carbon (C), etc.), and that the examples listed herein are merely illustrative.

Figure 2:
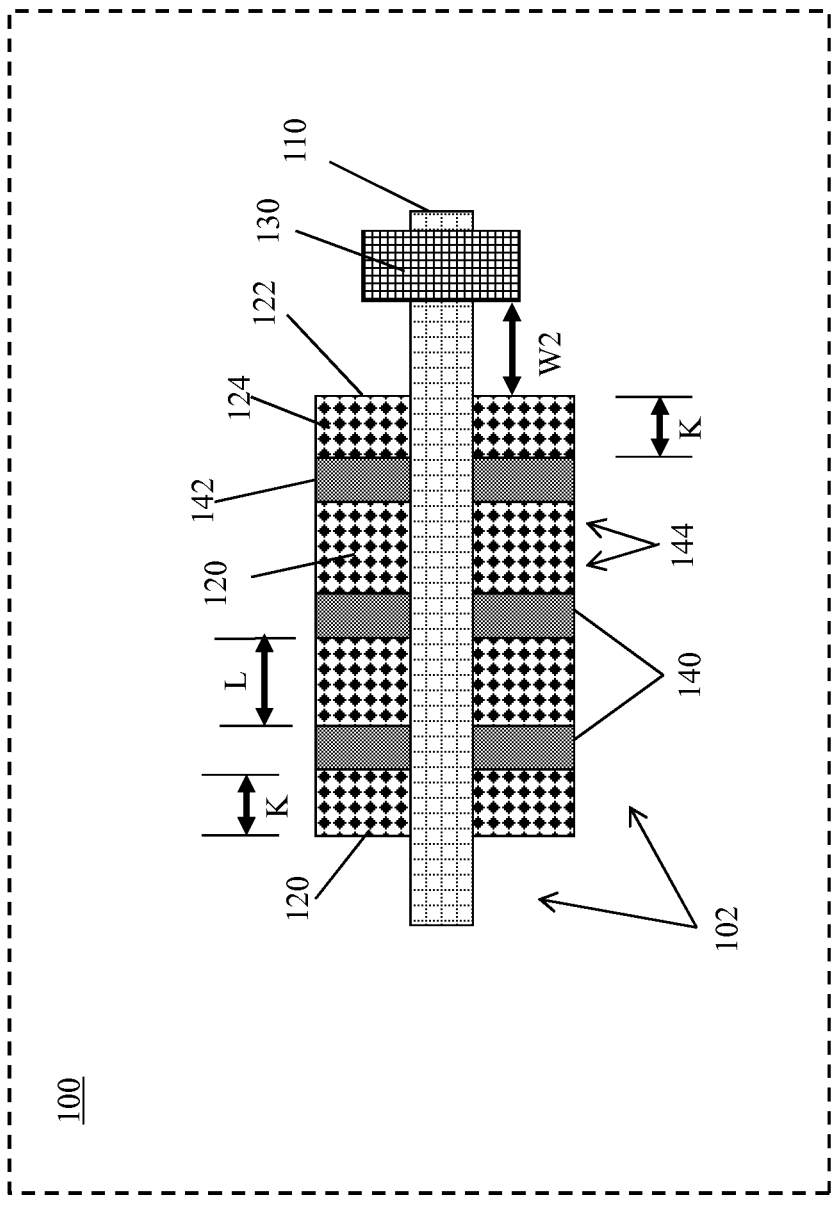
FIG. 2 is a demonstrative illustration of a top view of a portion of a semiconductor device according to an embodiment of the invention.

FIG. 2 is a demonstrative illustration of a top view of a portion of a known semiconductor device 100 including a fin-shaped field effect transistor (FINFET) 102 (e.g., a merged FINFET 102) which includes a plurality of fins 140 connected to a gate 110. Plurality of fins 140 are disposed proximate a gate contact 130, and a set of growths 120 (e.g., epitaxial growths) are disposed on surfaces of plurality of fins 140 (e.g., between). Outside end growths each have a thickness 'K' and internal growths have a thickness L/2. Epitaxial growths 120 may be epitaxially grown on surfaces of plurality of fins 140 to improve series resistance in source/drain regions of FINFET 102. As can be seen, a first fin 142 proximate gate contact 130 is connected to a growth 124 which extends toward gate contact 130 and defines a surface 122 of FINFET 102 proximate gate contact 130 at a distance of 'W2.' Surface 122 may be formed during epitaxial growth of set of growths 120 (e.g., as silicon grows on all surfaces of plurality of fins 140) and may impact some of the manufacturing processes and/or FINFET 102 performance. As set of growths 120 increase in thickness at the same rate, in order to span a gap 144 between plurality of fins 140 with a thickness of 'L', and thereby merge (e.g., join) set of growths between plurality of fins 140, each growth within gap 144 must have a thickness of at least L/2 (e.g., half the distance between the fins). This requirement on thickness to form a merged FINFET 102 also decreases distance W2. As distance 'W2' is reduced during epitaxial growth, the chances that a short will occur between gate contact 130 and surface 122 and/or a fin 140 increase. As a result, a number of fins 140 which may be disposed in FINFET 102, merging of set of growths 120, and/or thickness 'L' between plurality of fins 140 of FINFET 102 may be limited.

Figure 3:
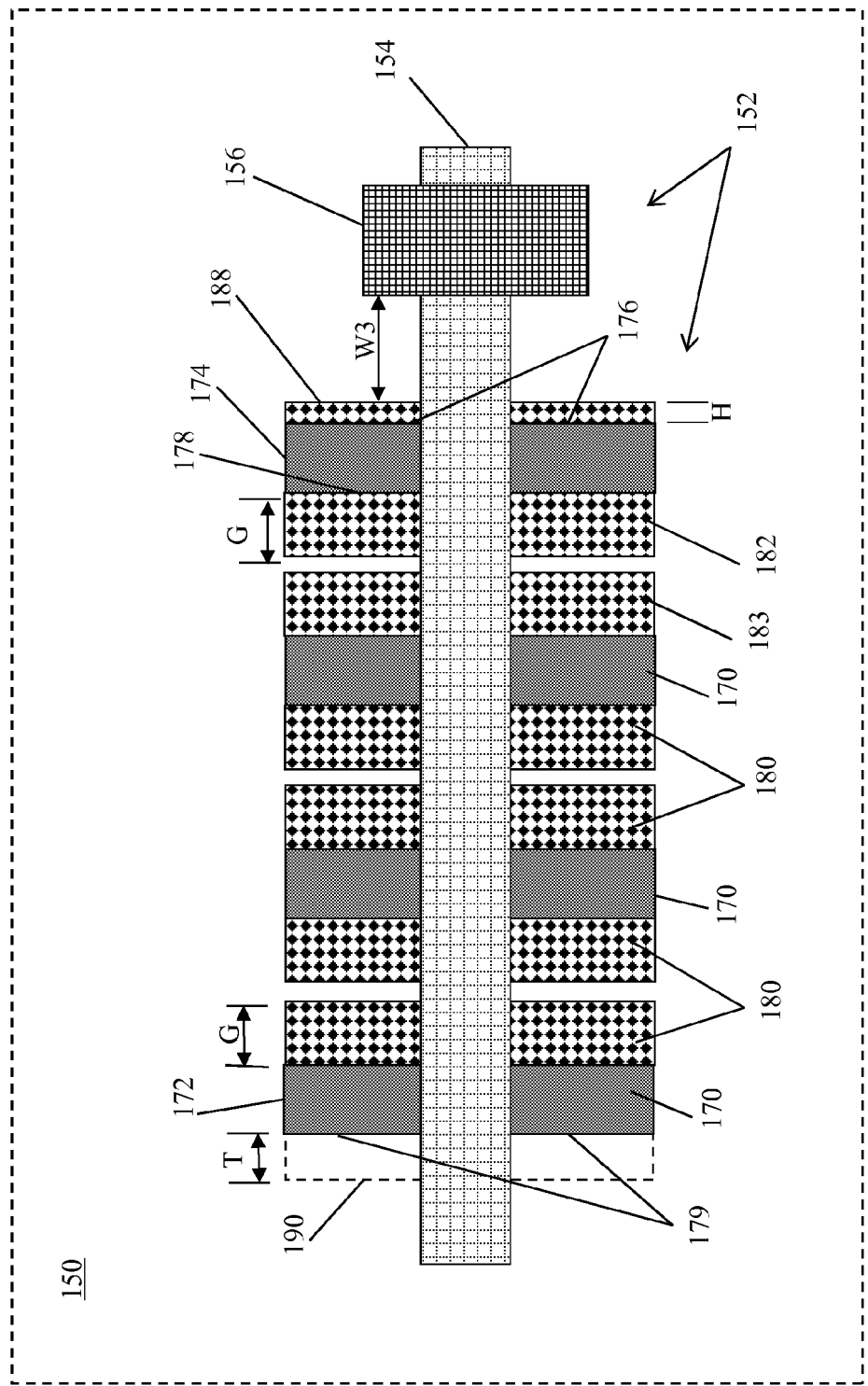
FIG. 3 is a demonstrative illustration of a top view of a portion of a semiconductor device according to an embodiment of the invention.

Turning to FIG. 3, a demonstrative illustration of a top view of a portion of a substrate 150 including a FINFET 152 is shown according to embodiments of the invention. FINFET 152 may be formed on substrate 150 with a set of fins 170 connected to a gate 154. A set of epitaxial regions 180 may be disposed between/on surfaces of set of fins 170. It is understood that the use, orientation, and arrangement of fins 170 and epitaxial regions 180 in this embodiment are merely illustrative. In an embodiment, FINFET 152 may include a first outer fin 174 connected to gate 154 and including a first outer surface 176 facing a gate contact 156 and a first inner surface 178 facing substantially away from gate contact 156 toward remainder of set of fins 170. A first epitaxial region 188 may be disposed on first outer surface 176 with a thickness 'H' and a second epitaxial region 182 may be disposed on first inner surface 178 with a thickness 'G.' As can be seen thickness G and H may have varying values relative to one another. "Thickness" as used herein is a lateral dimension relative to substrate 150 or thickness of material on a fin. In an embodiment, second epitaxial region 182 may be thicker than first epitaxial region 188 (e.g., thickness G may be greater than thickness H). This embodiment represents the case of a non-merged state of adjacent inner epitaxial regions 182, 183 of adjacent fins 174, 170 in that epitaxial region 182 does not merge or meet with an adjacent epitaxial region 183 of an adjacent fin. In this embodiment, epitaxial region 182 has a thickness G defined as a distance from first inner surface 178 to an edge of epitaxial region 182.

FINFET 152 may include a second outer fin 172 connected to gate 154 and including a third surface 179 which faces substantially away from set of fins 170. In an embodiment, third surface 179 may be substantially free of (e.g., not contacting) an epitaxial region. In one embodiment, a third epitaxial region 190 (shown in phantom) with a thickness 'T' may be connected to third surface 179. Thickness T may have a value which is equivalent to or different from thickness H. In any event, distance G is >H and T. It is understood that the thicknesses described herein and that any combination and/or variation of thicknesses may be used in accordance with embodiments of the invention.

Figure 4:
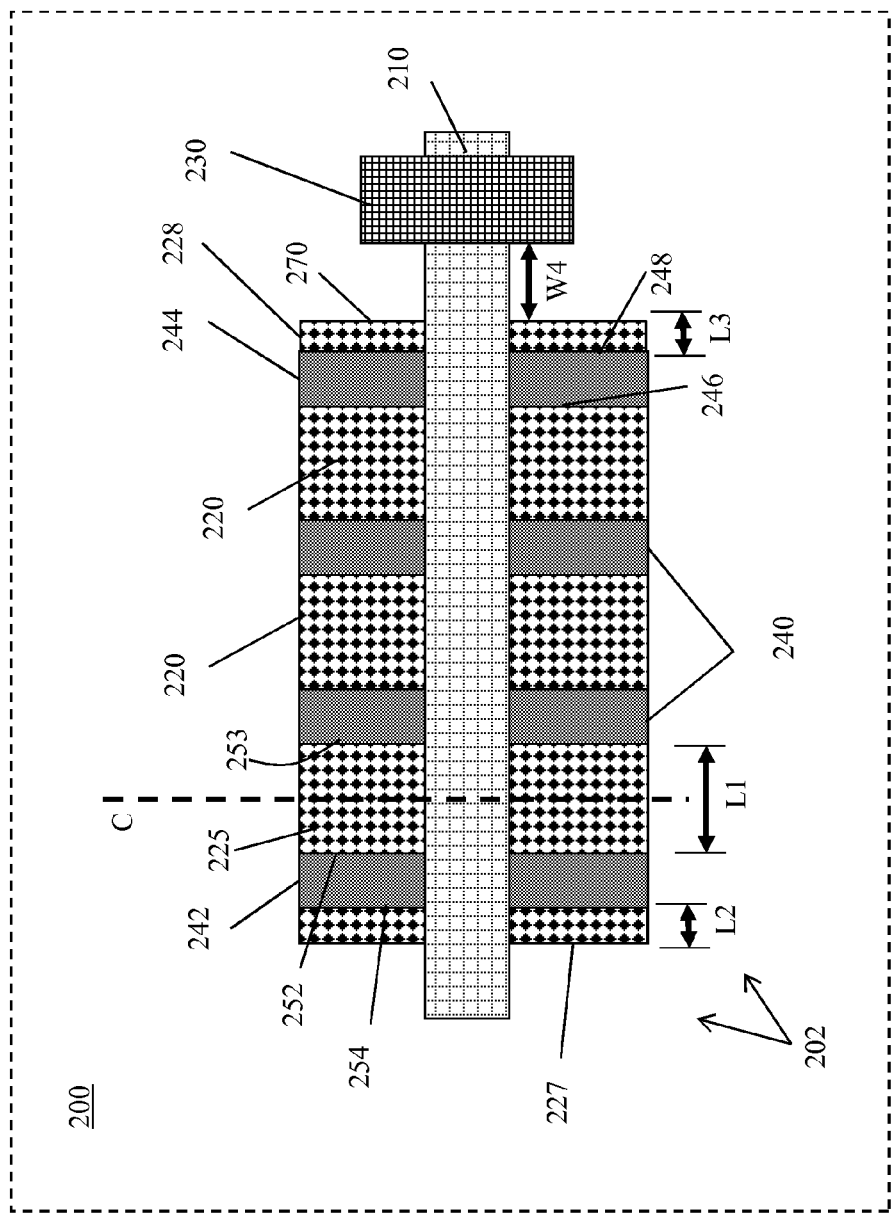
FIG. 4 is a demonstrative illustration of a top view of a portion of a semiconductor device according to an embodiment of the invention.

Turning to FIG. 4, a demonstrative illustration of a top view of a portion of a substrate 200 is shown including a FINFET 202 with a set of fins 240 which are merged in accordance with embodiments of the invention. FINFET 202 is connected to a gate 210 and includes a set of epitaxial regions 220, 225 disposed between/on surfaces of set of fins 240 which are separated by a distance L1. In this embodiment, epitaxial regions 220, 225 are merged, i.e., they meet between adjacent fins. It is understood that the use of fins 240 and epitaxial regions 220, 225 in this embodiment are merely illustrative, and that any form and/or configuration of fins, regions and/or materials may form or comprise set of fins 240 and/or epitaxial regions 220, 225, including materials and/or regions through which oxygen may diffuse.

In an embodiment, FINFET 202 may include a first outer fin 242 disposed on a gate 210 and including a first inner surface 252 facing a gate contact 230 and a first outer surface 254 facing substantially away from gate contact 230. An epitaxial region 225 may be disposed on first inner surface 252 with a thickness of at least L1/2 (e.g., extending to at least centerline 'C' to merge) and an epitaxial region 227 may be disposed on first outer surface 254 with a thickness L2. In an embodiment, FINFET 202 may include a second outer fin 244 connected to gate 210 between a gate contact 230 and first outer fin 242. Second outer fin 244 may include a second inner surface 246 facing away from gate contact 230 and a second outer surface 248 facing gate contact 230. A gate epitaxial region 228 may be disposed on second outer surface 248 with a third thickness L3. In one embodiment, L2 and/or L3 may be substantially 0 nanometers in thickness. Any of inner epitaxial regions 220, 225 may be merged epitaxial regions (e.g., epitaxially grown from different surfaces of set of fins 240 and merged to form a common region spanning L1). In this merged state embodiment in which adjacent inner epitaxial regions of adjacent fins 240, 242 merge to form a single epitaxial region 225, a thickness (half of L1) of epitaxial region 225 on a first inner surface 252 of first outer fin 242 may be defined as: half of a distance from first inner surface 252 to an opposing inner surface 253 of an adjacent fin 240. In one embodiment, epitaxial region 227 and/or gate epitaxial region 228 may have a substantially varied thickness relative to epitaxial regions 220, 225, and/or one another. A distance 'W4' between a surface 270 of gate epitaxial region 228 and gate contact 230 may be determined/regulated by thickness L3 of gate epitaxial region 228 which may be independent of thicknesses L1 and/or L2. In an embodiment, second epitaxial region 227 and/or gate epitaxial region 228 may be formed by thinning/removal (e.g., etching) of portions of epitaxial silicon to reduce thicknesses L2 and L3 respectively. In one embodiment, growth of epitaxial silicon on surfaces 248 and/or 254 may be controlled, limited, and/or prevented.

Figure 5:
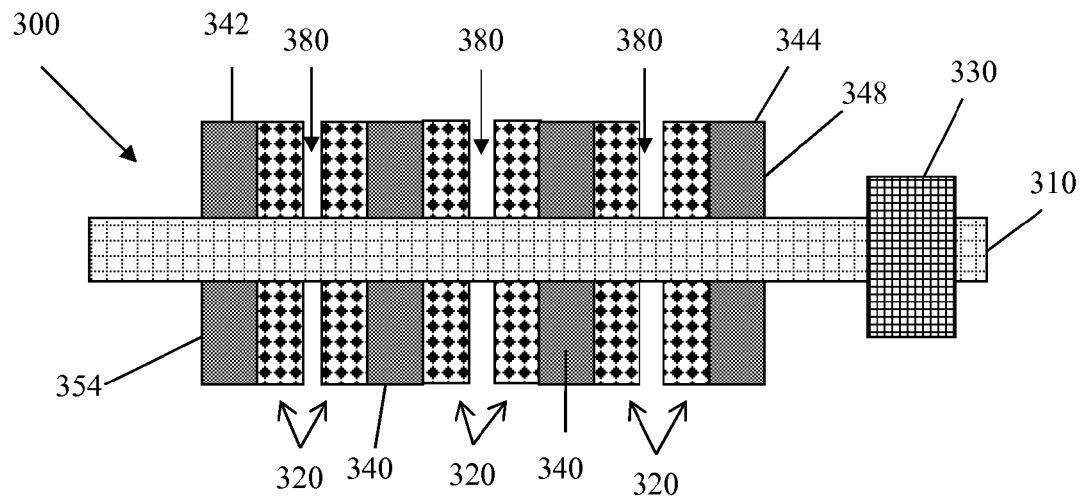
FIG. 5 is a demonstrative illustration of a top view of a portion of a semiconductor device according to an embodiment of the invention.

Turning to FIG. 5, a demonstrative illustration of a top view of a portion of a semiconductor device 300 is shown including a set of non-merged epitaxial regions 320 according to embodiments of the invention. In this embodiment, set of epitaxial regions 320 may only be grown on inner surfaces of a set of fins 340 (e.g., between set of fins 340) and may not contact/merge with one another. Set of epitaxial regions 320 may define a set of notches 380 between each set of adjacent fins in set of fins 340. In an embodiment, a first outer surface 354 of a first outer fin 342 and/or a second outer surface 354 of a second outer fin 344 may be substantially free of epitaxial growth (e.g., no epitaxial region connected thereto).

Figure 6:
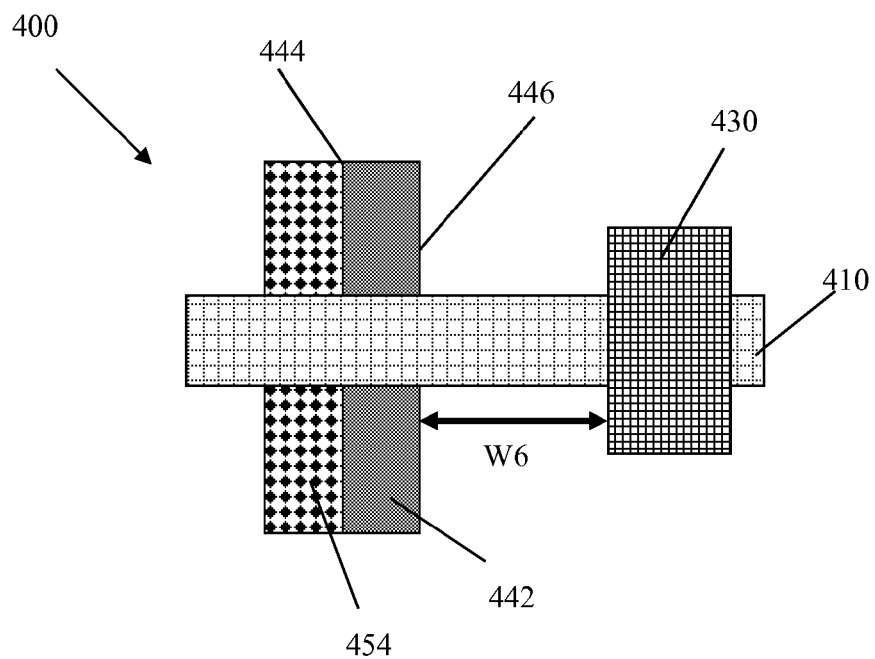
FIG. 6 is a demonstrative illustration of a top view of a portion of a semiconductor device according to an embodiment of the invention.
Figure 7:
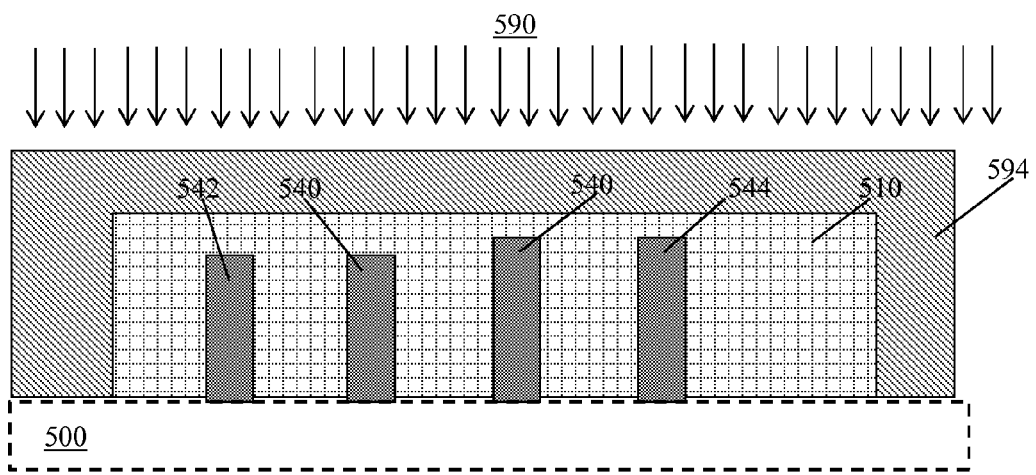
FIGS. 7-13 are demonstrative illustrations of methods of forming a semiconductor device according to embodiments of the invention.

Turning to FIG. 6, a demonstrative illustration of a top view of a portion of a FINFET 400 is shown including a fin 442 connected to a gate 410 at a distance 'W6' from a gate contact 430 according to embodiments of the invention. In this embodiment, fin 442 may have an epitaxial region disposed on only a single surface (e.g., a first surface 444). FINFET 400 may include an epitaxial region 454 disposed on a first surface 444 which is located substantially opposite/facing away from gate contact 430. A second surface 446 of fin 442 may face gate contact 430 and may be substantially free of epitaxial regions (e.g., no epitaxial region connected thereto). In one embodiment, distance W6 may represent a distance between gate contact 430 and second surface 446.

FIGS. 7-13 are demonstrative illustrations of a device undergoing processes in a method according to embodiments. Although FIGS. 7-13 show the method of forming portions of FINFET 152 in FIG. 3, it is understood that a similar method may be employed to form any other like semiconductor device and that any other processes and features may be included as a part of the build process.

Returning to FIG. 7, a demonstrative illustration of a cross-sectional side view of portions of a substrate 500 (shown in phantom) undergoing a process according to embodiments is shown. In this embodiment, a set of inner fins 540, a first outer fin 542 and a second outer fin 544 are formed and connected to a gate 510 which is formed on substrate 500. Gate 510 and fins 540, 542, and 544 may be formed using any gate deposition, etch, and/or spacer formation processes/techniques. As shown, in this embodiment, a deposition 590 (e.g., a blanket deposition) of a middle-of-the-line (MOL) dielectric 550 may be performed to substrate 500. As used herein, the term "depositing" may include any now known or later developed techniques appropriate for the material to be deposited including but not limited to, for example: chemical vapor deposition (CVD), physical vapor deposition (PVD), etc.

Figure 8:
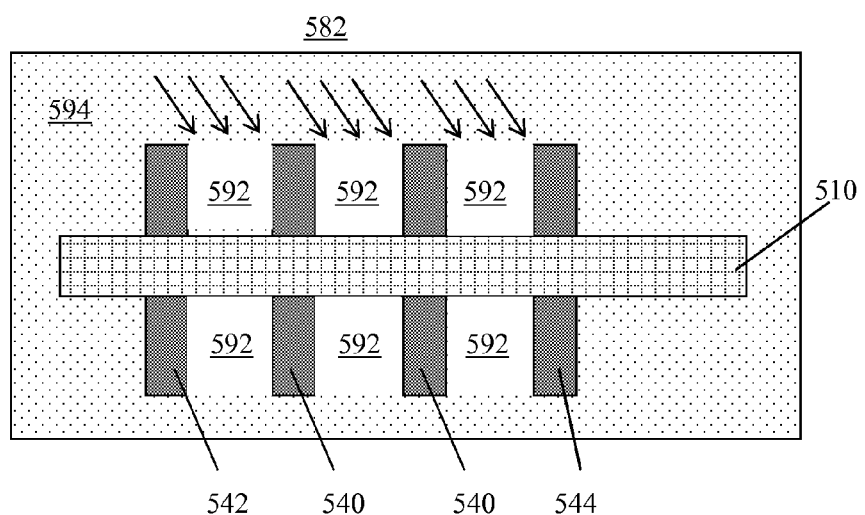

Next, in FIG. 8 is a demonstrative illustration of a top view of portions of substrate 500 undergoing a selective etch 582 (arrows) following deposition 590 of dielectric region 594 is shown accordance with embodiments. After deposition 590, dielectric region 594 may undergo planarization to substantially level a top surface. Selective etch 582 may align some edges of openings to restrict epitaxial growth (e.g., epitaxial silicon growth) selectively on some FIN sides/surfaces. In one embodiment, selective etch 582 may include a mask and etch process. In another embodiment, selective etch 582 may be performed using a reactive ion etch (RIE). As is known in the art of semiconductor fabrication, RIE uses chemically reactive plasma to remove material deposited on wafers/substrates. Selective etch 582 may form a set of apertures 592 between fins 540, 542, and 544. Selective etch 582 may be performed through any now known or later developed etch methods as discussed herein. In an embodiment, selective etch 582 may only remove portions of dielectric layer 594 between fins 540, 542, and 544, thereby exposing portions of substrate 500 and forming set of apertures 592. Selective etch may extend on top of set of fins 540, 542, and/or 544, removing a portion (e.g., half way across a width of the fin) and/or all of dielectric region 594 formed thereon.

Figure 9:
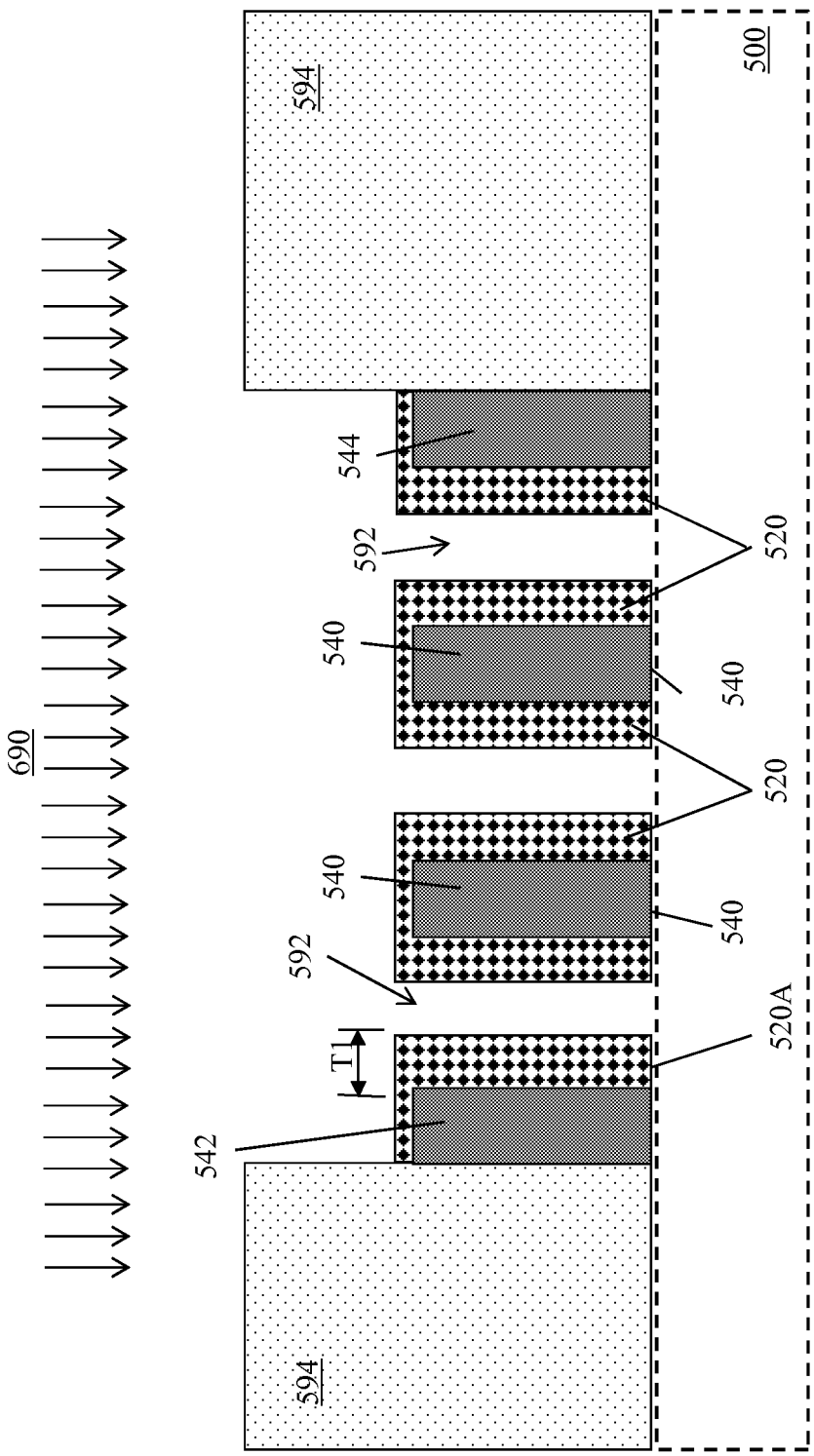
Figure 10:
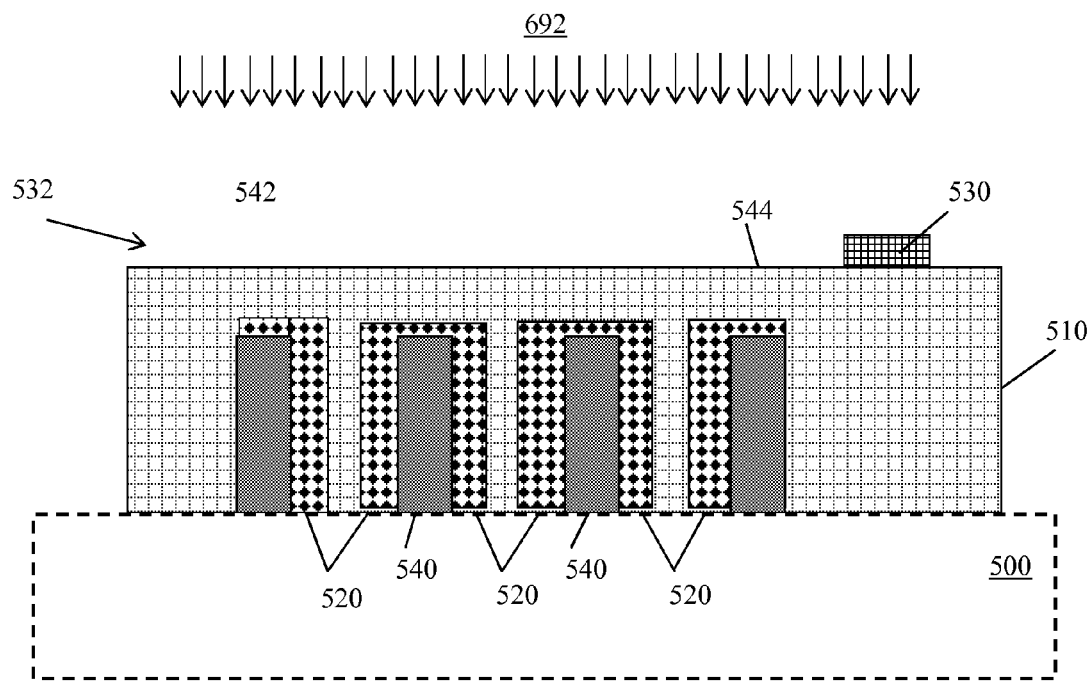

FIGS. 9-10 illustrate processing resulting in a non-merged state between epitaxial regions between adjacent fins. Following selective etch 582, as shown in FIG. 9, an epitaxial growth 690 (e.g., epitaxial growth of silicon, a selective epitaxial process, etc.) may be applied to substrate 500 to form a set of epitaxial regions 520 in set of apertures or openings 592 (e.g., between set of fins 540, first outer fin 542, and second outer fin 544). Dielectric region 594 may inhibit and/or prevent growth of epitaxial regions 520 thereon. In an embodiment, dielectric region 594 may contact an outer surface of first outer fin 542 and second outer fin 544 preventing epitaxial growth thereupon, and thereby limiting growth of epitaxial regions 520 to the exposed surfaces between fins 540, 542, and/or 544. It is understood that the use of an epitaxial growth process as described herein, is for illustrative purposes, and that any like treatments, chemicals, elements and formulas may be used in accordance with this invention.

Next, in FIG. 10, is a demonstrative illustration of a side view of portions of substrate 500 undergoing a set of finishing processes 692 following epitaxial growth 690 in accordance with embodiments. As can be seen, finishing processes 692 may remove dielectric region 594, form gate contact 530, etc., thereby creating a FINFET 532. Finishing processes 692 may include any no known or later developed manufacturing processes including dummy gate processes, etching, etc.

Figure 11:
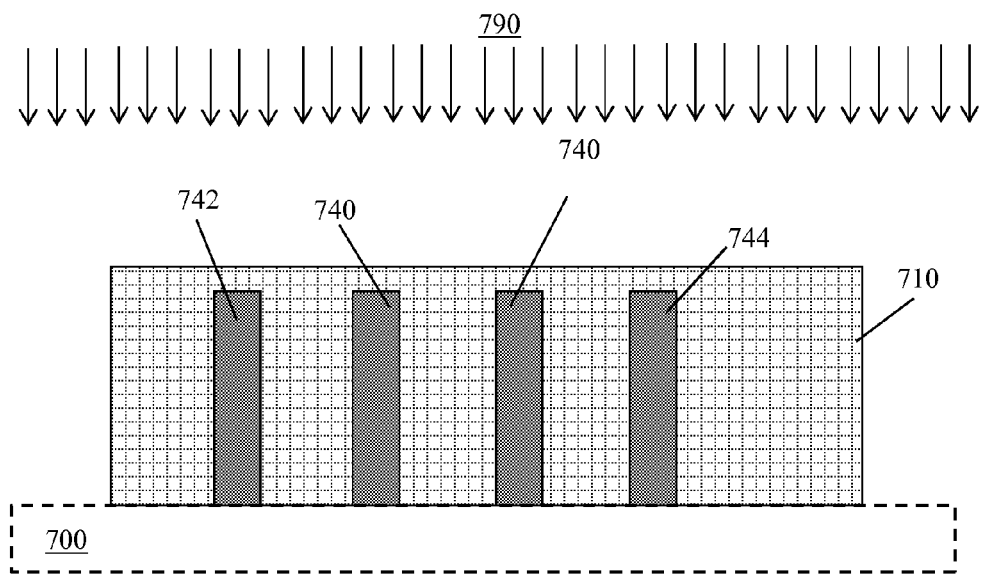
Figure 12:
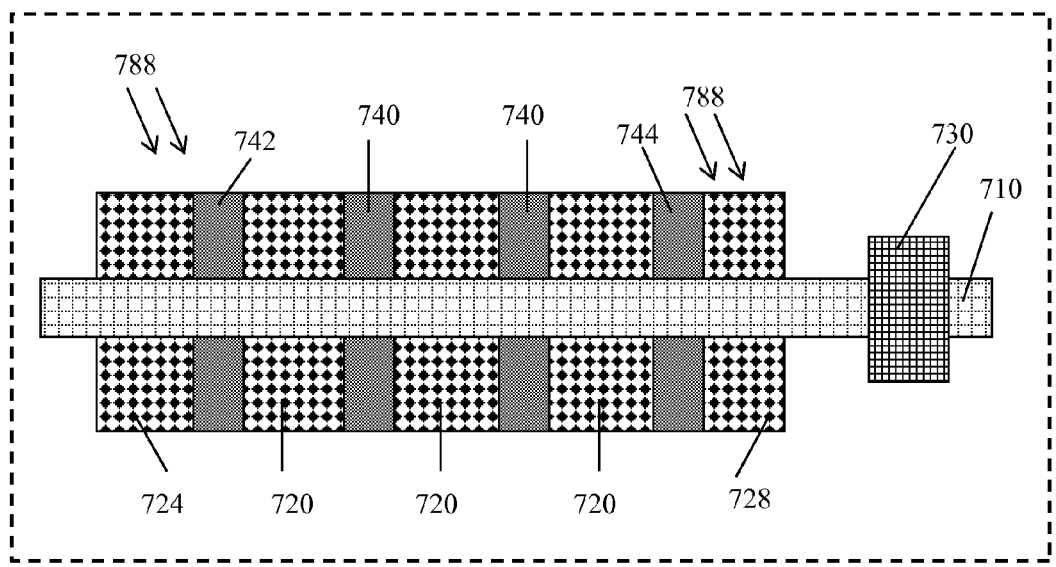
Figure 13:
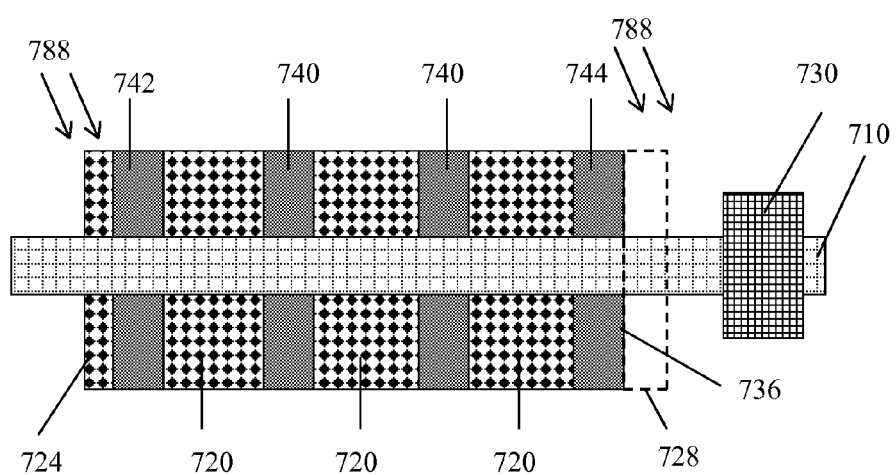

FIGS. 11-13 are demonstrative illustrations of a device undergoing processes in a method according to embodiments. FIGS. 11-13 illustrate a merged state between epitaxial regions between adjacent fins. Although FIGS. 11-13 show the method of forming portions of FINFET 152 in FIG. 3, it is understood that a similar method may be employed to form any other like semiconductor device and that any other processes and features may be included as a part of the build process.

Returning to FIG. 11, a demonstrative illustration of a cross-sectional side view of portions of a substrate 700 (shown in phantom) undergoing a process according to embodiments is shown. In this embodiment, a set of inner fins 740, a first outer fin 742 and a second outer fin 744 are formed and connected to a gate 710 which is formed on substrate 700. Gate 710 and fins 740, 742, and 744 may be formed using any gate deposition, etch, and/or spacer formation processes/techniques. As shown, in this embodiment, an epitaxial growth 790 (e.g., growth of epitaxial silicon) may be performed to substrate 700. Epitaxial growth 790 may substantially cover surfaces of fins 740, 742, and 744 in epitaxial silicon as shown in the top view of FIG. 12. In this embodiment, selective mask and etch process 788 may be applied to substrate 700 to thin/remove portions of first epitaxial region 724 and/or gate epitaxial region 728 while retaining epitaxial regions 720 between fins 740, 742, and 744. In one embodiment, shown in FIG. 13, gate epitaxial region 728 (shown in phantom) may be completely removed by selective mask and etch process 788 while first epitaxial region 724 may be retained and thinned. Removal of gate epitaxial region 728 may form a FINFET 732 with second outer surface 736 directly exposed to gate contact 730.

Figure 14:
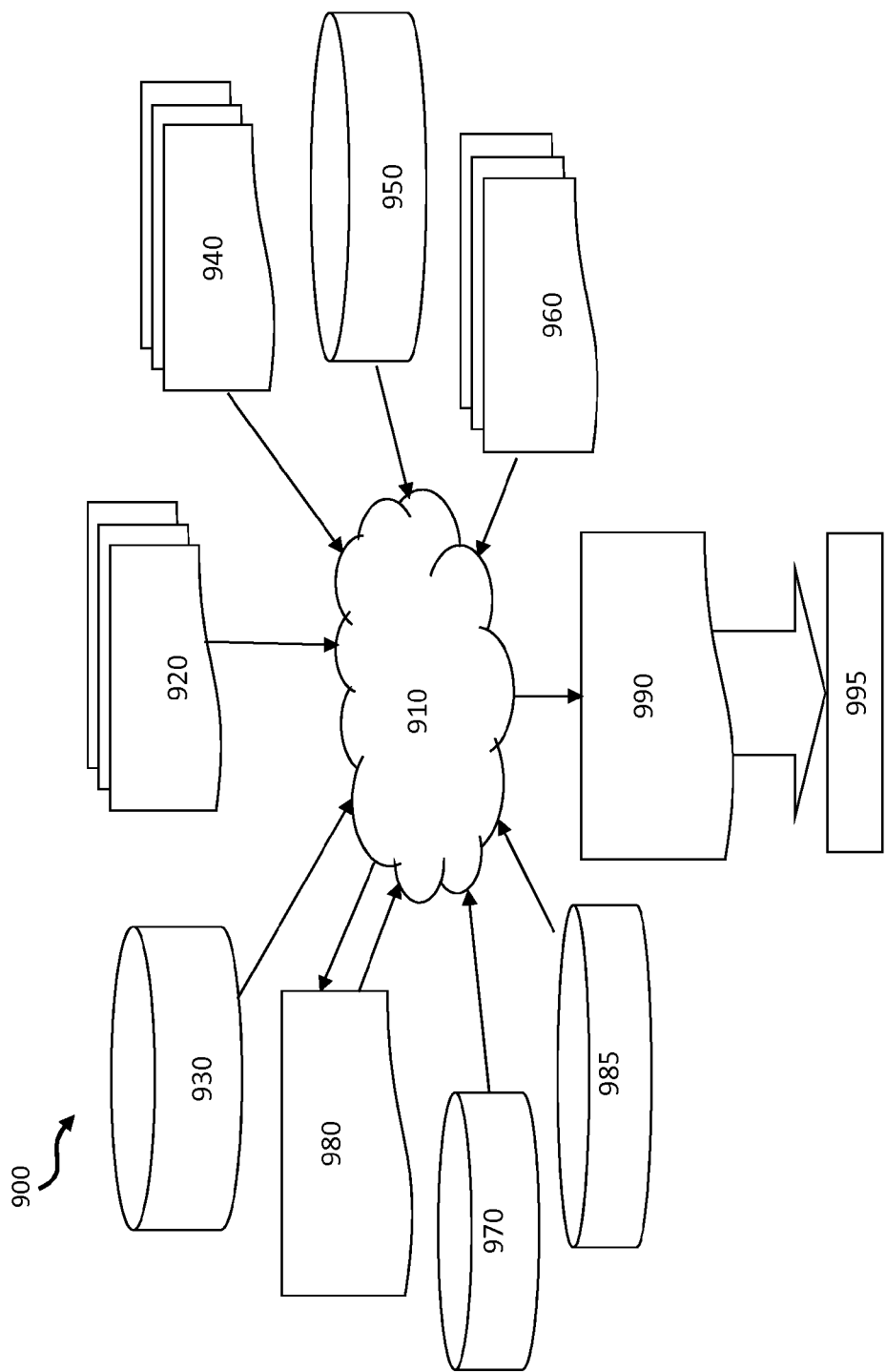
FIG. 14 is a demonstrative illustration of a flow diagram of a design process used in semiconductor design, manufacture, and/or test according to embodiments of the invention.

FIG. 14 shows a demonstrative illustration of a flow diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIG. 3. The design structures processed and/or generated by design flow 900 may be encoded on machine-readable transmission or storage media to include data and/or instructions that when executed or otherwise processed on a data processing system generate a logically, graphically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA).

FIG. 14 illustrates multiple such design structures (e.g., textual representations, graphical representations, data structural representations, etc.) including an input design structure 920 that is preferably processed by a design process 910. Design structure 920 may be a logical simulation design structure generated and processed by design process 910 to produce a logically equivalent functional representation of a hardware device, and may include a text or a graphical representation. Design structure 920 may include at least one of a textual representation, a graphical representation, and a data structural representation of an integrated circuit and/or components thereof. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIG. 2. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIG. 2 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit or semiconductor design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 2. In one embodiment, design structure 990 may comprise a compiled, executable HDL simulation model that functionally simulates the devices shown in FIG. 2.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 2. Design structure 990 may then proceed to a stage 995 where, for example, design structure 990: proceeds to tape-out, is released to manufacturing, is released to a mask house, is sent to another design house, is sent back to the customer, etc.

The substrate can comprise any commonly used substrate material including but not limited to silicon, germanium, silicon germanium, silicon carbide, and those consisting essentially of one or more Group III-V compound semiconductors having a composition defined by the formula AlX1GaX2InX3AsY1PY2NY3SbY4, where X1, X2, X3, Y1, Y2, Y3, and Y4 represent relative proportions, each greater than or equal to zero and X1+X2+X3+Y1+Y2+Y3+Y4=1 (1 being the total relative mole quantity). The substrate may also be comprised of Group II-VI compound semiconductors having a composition ZnA1CdA2SeB1TeB2, where A1, A2, B1, and B2 are relative proportions each greater than or equal to zero and A1+A2+B1+B2=1 (1 being a total mole quantity). The processes to provide the substrate, as illustrated and described, are well known in the art and thus, no further description is necessary. Further, gate 110 can comprise any commonly used gate material including but not limited to polysilicon or high melting point refractory metals, such as W, Ti, Ta, Mo, Nb, Re, Ru and their binary or ternary metallic derivatives, e.g. WN, TiN, TaN, MoN, MoO2, TaSiN.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the regions thereon) to be etched or otherwise processed.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While various embodiments are described herein, it will be appreciated from the specification that various combinations of elements, variations or improvements therein may be made by those skilled in the art, and are within the scope of the invention. In addition, many modifications may be made to adapt a particular situation or material to the teachings of the invention without departing from essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A semiconductor device comprising:
   a substrate; and
   a fin-shaped field effect transistor (FINFET) disposed on the substrate, the FINFET including:
   a set of fins disposed proximate a gate; and
   a set of epitaxial regions disposed in a source/drain region on the set of fins, the set of epitaxial regions including:
   a first epitaxial region on a first inner surface of a first outer fin, the first epitaxial region having a first thickness defined as one of: a) a distance from the first inner surface to an edge of the epitaxial region in the case of a non-merged state of adjacent inner epitaxial regions of adjacent fins, and b) half of a distance from the first inner surface to an opposing inner surface of an adjacent fin in a merged state of adjacent inner epitaxial regions of adjacent fins, and a second epitaxial region with a second thickness disposed on a first outer surface of the first outer fin,
wherein the second thickness is thinner than the first thickness.

2. The semiconductor device of claim 1, wherein the set of fins includes:
a second outer fin disposed on the gate proximate a gate contact, the second outer fin including a second outer surface facing the gate contact and a second inner surface facing the first outer fin;
a plurality of fins disposed on the gate between the first outer fin and the second outer fin.

3. The semiconductor device of claim 2, wherein epitaxial regions disposed between the plurality of fins are in the merged state.

4. The semiconductor device of claim 2, further comprising a gate epitaxial region disposed on the second outer surface.

5. The semiconductor device of claim 1, wherein the second thickness of the second epitaxial region is substantially 0 nanometers.

6. The semiconductor device of claim 1, wherein the second epitaxial region includes an etched surface substantially opposite the first outer fin.

7. A method of forming a semiconductor device, the method comprising:
forming a set of fins, the set of fins including a first outside fin;
forming a gate including a gate contact, the gate contact located proximate to the first outside fin;
forming a set of inner epitaxial regions between the set of fins including a first epitaxial region on an inner surface of a first outer fin, the first epitaxial region having a first thickness defined as one of: a) a distance from the first inner surface to an edge of the epitaxial region in the case of a non-merged state of adjacent inner epitaxial regions of adjacent fins, and b) half of a distance from the first inner surface to an opposing inner surface of an adjacent fin in a merged state of adjacent inner epitaxial regions of adjacent fins; and
forming a gate epitaxial region on an outer surface of the first outside fin, the gate epitaxial region having a second thickness which is different than the first thickness of the set of inner epitaxial regions.

8. The method of claim 7, wherein the forming the gate epitaxial region includes:
growing the gate epitaxial region on the outer surface of the first outside fin;
masking the semiconductor device in preparation for selective removal of portions of the set of epitaxial regions and the gate epitaxial region; and
etching the gate epitaxial region to reduce a thickness of the gate epitaxial region.

9. The method of claim 8, wherein the growing the gate epitaxial region includes:
merging adjacent epitaxial regions between each fin in the set of fins; and
etching the epitaxial regions to remove epitaxial growth formed above a height of the fins and on an outside surface of the first outside fin.

10. The method of claim 8, wherein the forming the set of epitaxial regions includes:
depositing a dielectric layer on the semiconductor device;
masking a pattern on the dielectric layer to expose a nested region between the set of fins;
etching the nested region to remove the dielectric layer therein; and
growing the set of epitaxial regions in the nested region between the set of fins.

11. The method of claim 8, wherein the forming the set of epitaxial regions includes:
depositing a dielectric layer on the semiconductor device;
masking a pattern on the dielectric layer about the set of fins;
etching the dielectric layer to expose surfaces of the set of fins,
wherein the etching exposes surfaces between the set of fins; and
growing the set of epitaxial regions on the exposed surfaces of the set of fins.

12. The method of claim 8, further comprising:
masking the set of epitaxial regions following the growing the set of epitaxial regions; and
selectively etching the epitaxial regions.

13. A design structure embodied in a machine-readable storage medium for design, manufacturing, or testing, the design structure comprising text or a graphical representation of:
a substrate; and
a fin-shaped field effect transistor (FINFET) disposed on the substrate, the FINFET including:
a set of fins disposed proximate a gate, and
a set of epitaxial regions disposed in a source/drain region on the set of fins, the set of epitaxial regions including:
a first epitaxial region on a first inner surface of a first outer fin, the first epitaxial region having a first thickness defined as one of: a) a distance from the first inner surface to an edge of the epitaxial region in the case of a non-merged state of adjacent inner epitaxial regions of adjacent fins, and b) half of a distance from the first inner surface to an opposing inner surface of an adjacent fin in a merged state of adjacent inner epitaxial regions of adjacent fins, and
a second epitaxial region with a second thickness disposed on a first outer surface of the first outer fin,
wherein the second thickness is thinner than the first thickness.

14. The design structure of claim 13, wherein the set of fins includes:
a second outer fin disposed on the gate proximate a gate contact, the second outer fin including a second outer surface facing the gate contact and a second inner surface facing the first outer fin;
a plurality of fins disposed on the gate between the first outer fin and the second outer fin.

15. The design structure of claim 14, wherein epitaxial regions disposed between the plurality of fins are in the merged state.

16. The design structure of claim 14, further comprising a gate epitaxial region disposed on the second outer surface.

17. The design structure of claim 14, wherein the second thickness of the second epitaxial region is substantially 0 nanometers.

18. The design structure of claim 14, wherein the second epitaxial region includes an etched surface substantially opposite the first outer fin.

* * * * *